(12) United States Patent
Kumeth

(10) Patent No.: US 6,553,656 B1
(45) Date of Patent: Apr. 29, 2003

(54) ASSEMBLY OR MANUFACTURING ROBOT AND WORK STATION FOR THE SAME

(75) Inventor: Siegmund Kumeth, Amberg (DE)

(73) Assignee: Feintool International Holding, Lyss (CH)

( * ) Notice: Subject to any disclaimer, the term of this patent is extended or adjusted under 35 U.S.C. 154(b) by 0 days.

(21) Appl. No.: 09/445,453
(22) PCT Filed: Jun. 18, 1998
(86) PCT No.: PCT/DE98/01666

§ 371 (c)(1),
(2), (4) Date: Mar. 10, 2000

(87) PCT Pub. No.: WO98/58763
PCT Pub. Date: Dec. 30, 1998

(30) Foreign Application Priority Data

| Jun. 21, 1997 | (DE) | 197 26 374 |
| Jun. 26, 1997 | (DE) | 297 11 127 U |
| Jul. 2, 1997 | (DE) | 197 28 264 |
| Aug. 5, 1997 | (DE) | 197 33 774 |

(51) Int. Cl.[7] .......................... B23P 21/00; B23P 23/00; B23Q 41/00
(52) U.S. Cl. .............................. 29/785; 29/38 A; 29/563
(58) Field of Search .................... 29/785, 749, 700, 29/701, 38 A, 563, 38 B

(56) References Cited

U.S. PATENT DOCUMENTS 4,351,096 A * 9/1982 Depweg et al. ............. 29/38 A
4,455,956 A * 6/1984 Yamamoto et al. ......... 112/274
4,523,359 A * 6/1985 Gippa .......................... 29/38 A
5,015,149 A * 5/1991 Weiss ......................... 414/751
5,031,295 A 7/1991 Schmitt
5,640,756 A * 6/1997 Brown et al. ................ 29/701
5,692,293 A * 12/1997 Igarashi et al. .............. 29/740

FOREIGN PATENT DOCUMENTS

| EP | 0 401 808 A1 | 12/1990 |
| EP | 0 534 451 A1 | 3/1993 |
| EP | 0 749270 A1 | 12/1996 |
| JP | 0401808 | * 12/1990 |

* cited by examiner

Primary Examiner—Gregory M. Vidovich
Assistant Examiner—John C. Hong
(74) Attorney, Agent, or Firm—Hoffman, Wasson & Gitler, PC

(57) ABSTRACT

An automatic assembly or production machine and workstation for such a machine which has a rotor that is rotatable around a vertical machine access, and has several receptacles on the periphery of the rotor for components or work pieces to be assembled or for subassemblies. The machine has a central drive means for the rotor for moving the receptacles in a cyclic movement from one work position to the next. Each work position has primary functional elements with a common control unit for them driven by a central drive assembly and producing controlled movements of the element in at least one axial direction in synchronization with the cyclic rotary movement of the rotor.

28 Claims, 9 Drawing Sheets

ASSEMBLY OR MANUFACTURING ROBOT AND WORK STATION FOR THE SAME

BACKGROUND OF THE INVENTION

The invention pertains to an automatic assembly or production machine.

Assembly machines of this type are generally known and are used, for example, for the automatic production or assembly of components or sub-assemblies of individual components that are supplied to work stations and assembled onto the components or assembled sub-assemblies that are moved past on the receptacles and conveyed to the work stations by means of these receptacles, so that the components or sub-assemblies are assembled successively on the receptacles. The receptacles are, for example, arranged on a rotating table element.

The work stations can also be partially conceived as inspection stations. Each work station is located at a work position. When the components have very small dimensions, a very accurate and precise arrangement of the receptacles on the periphery of a rotating table is necessary.

SUMMARY OF THE INVENTION

The object of the invention is to provide an automatic production machine that is characterized by a simple and universal construction such that this production machine (also the basic unit of this machine) can be used for various purposes, whereby it is only necessary to configure or select certain functional elements according to the individual application. To solve this problem, an automatic production machine with a rotor that is rotatable around a vertical machine axis (V), and having several receptacles on the periphery of the rotor for components or work pieces to be assembled or for subassemblies, with a central drive means for the rotor for moving the receptacles in a cyclic movement from one work position to the next. Each work position has primary functional elements with a common control unit for them driven by a central drive assembly and producing controlled movements of the elements in at least one axial direction (A,B) in synchronization with the cyclic rotary movement of the rotor, wherein the common control direction of all the primary functional elements has at least one common plate-like lifting element that forms a control or cam surface with which the control elements work together to produce the movements on or in the one axis (A,B). The disk cam for a stroke in the direction of the machine axis (V) is provided for on a lifting or tie rod, which is guided in a central part of the machine frame and the axis which is parallel to the machine axis (V), but radially offset from it.

A further aspect of the invention presents an assembly machine with versatile applications. To solve this problem an assembly machine with a jig stand and with at least one rotatable table element located on the jig stand with several receptacles provided on the periphery of the table for components to be assembled.

A special feature of this assembly machine according to the invention, lies in the fact that the receptacles are connected by means of sockets on the periphery of the rotating table element and can thus be easily installed and removed or exchanged. Nevertheless, the special construction of the retainers ensures precise positioning and guiding of the receptacles after inserting them.

BRIEF DESCRIPTION OF THE DRAWINGS

The invention is now explained in more detail by means of an example embodiment with reference to the figures, which depict as follows.

DETAILED DESCRIPTION OF THE INVENTION

Figure 1:
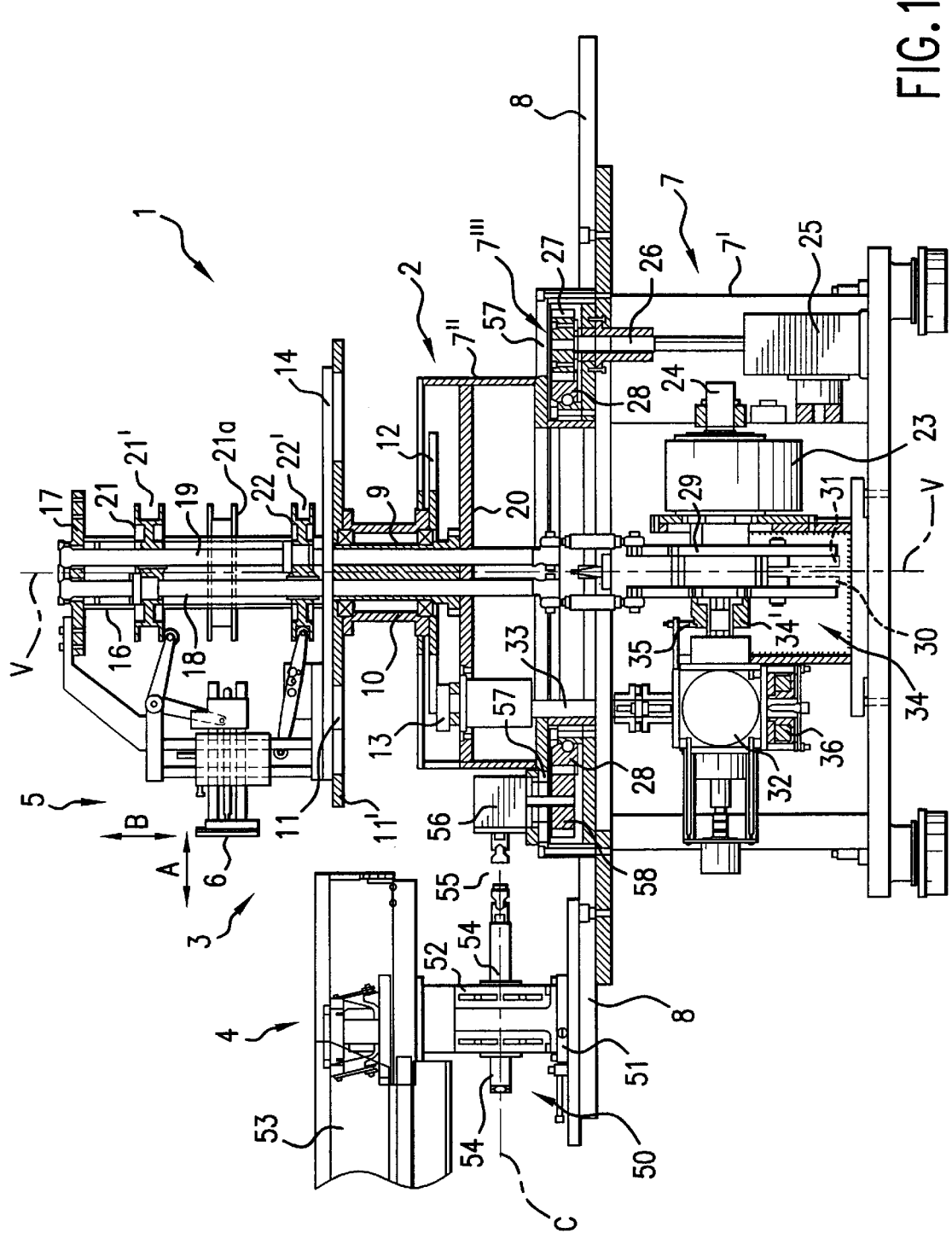
FIG. 1 shows a simplified depiction of a vertical view through an automatic production machine according to the invention.
Figure 2:
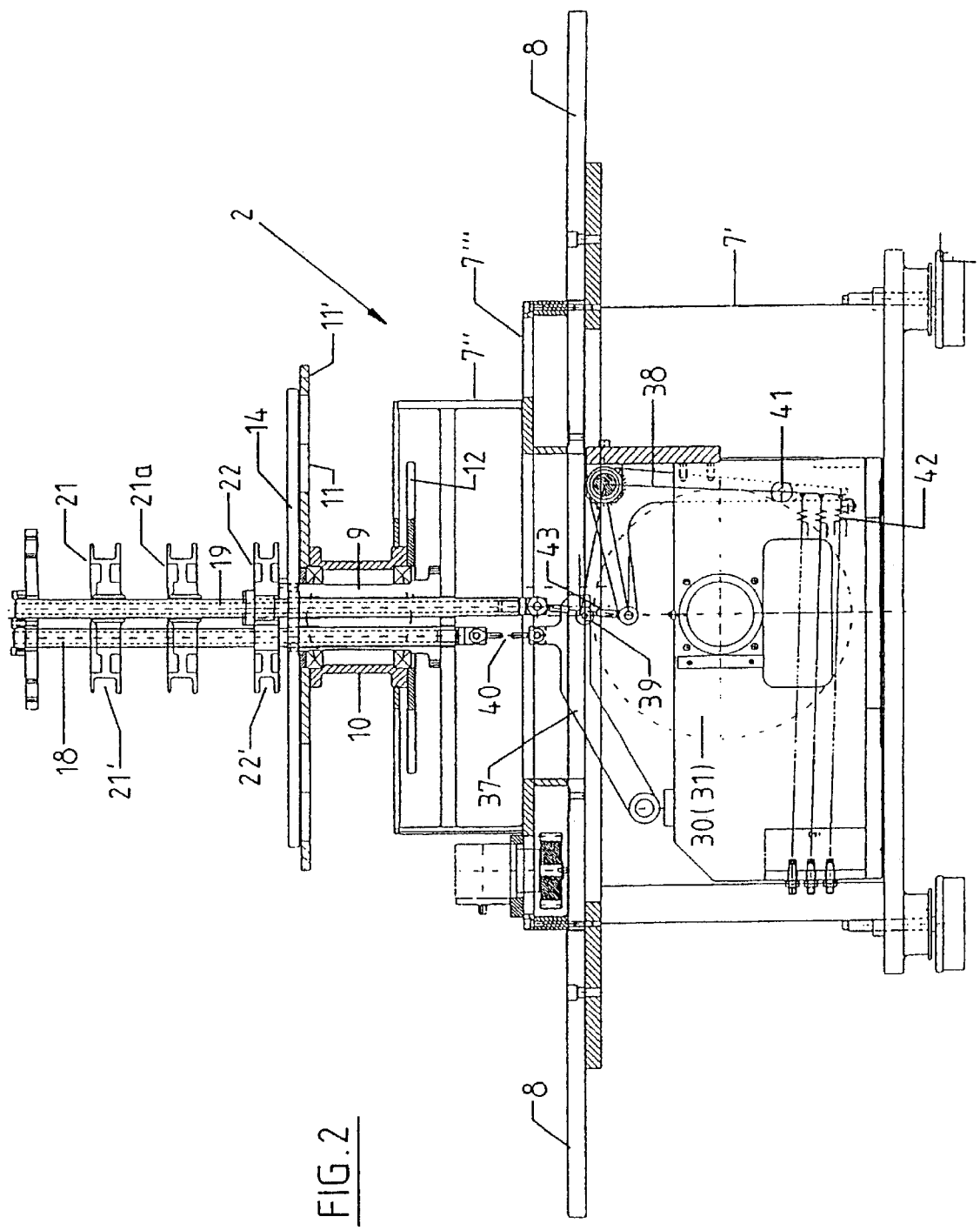
FIG. 2 shows a depiction as in FIG. 1, however in a different cross-plane.
Figure 3:
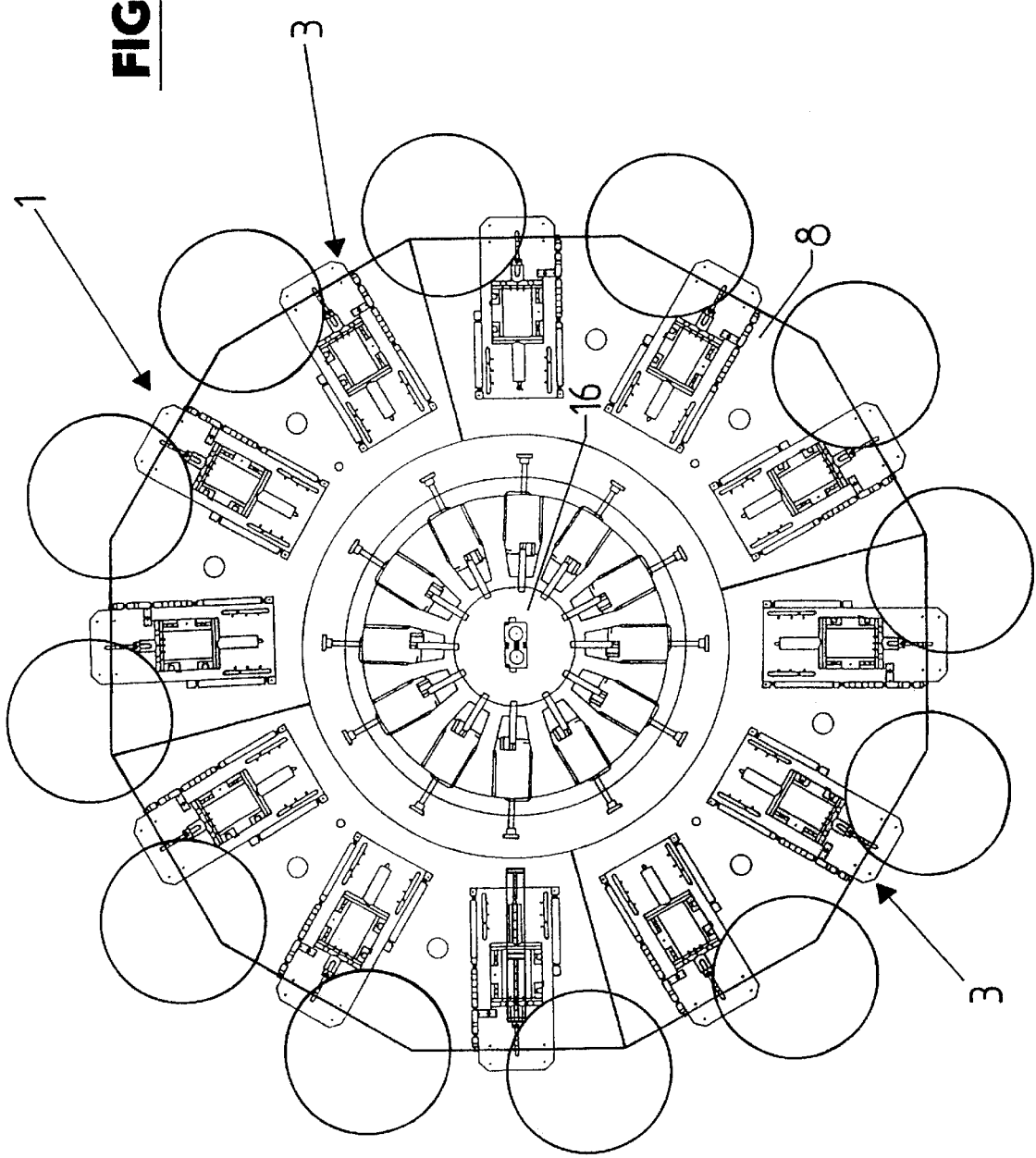
FIG. 3 shows a simplified depiction of a top view of the automatic production machine in FIGS. 1 and 2.
Figure 4:
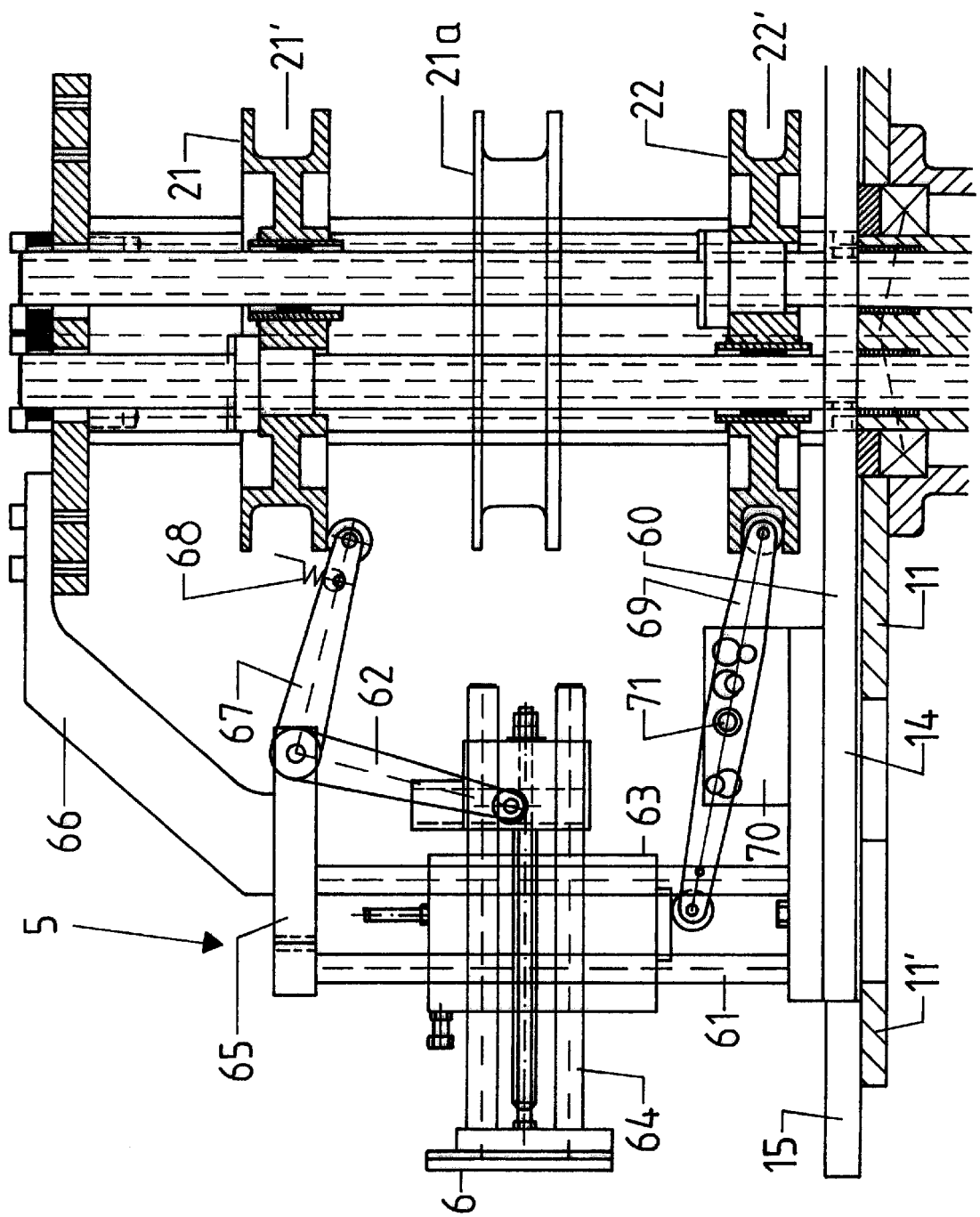
FIG. 4 shows an enlarged depiction of a detail from FIG. 1.

The automatic production machine depicted in the figures, and referred to there generally as 1, is used for the manufacture of components or sub-assemblies made up of numerous individual parts that are mechanically put together or assembled onto the respective assembly element or sub-assembly in the automatic production machine. The automatic production machine 1 is especially suited for the manufacture of very small mechanical and/or electro-mechanical components, e.g. micro-switches etc.

The automatic production machine includes a basic unit 2 and a plurality of work stations 4 distributed on the vertical middle or machine axis V of the basic unit. At the work positions 3, for example, stations 4 for supplying components are provided for that are part of the sub-assembly or component to be manufactured and are assembled at the respective work position onto the already partially assembled sub-assembly conveyed past that station. Some of the work positions 3 are, for example, also measuring and/or inspection positions. In the figures, each work position 3 is assigned a lifting unit 5 with a tool support 6 which, in the manner described in more detail below, executes a horizontal lift (double arrow A) or vertical lift (double arrow B) in synchronization with the drive assembly or the workpiece cycle of the basic unit 2, whereby the horizontal lift preferably takes place radially or essentially radially to the axis V.

The basic unit 2 has a machine frame or casing 7 in which e.g. the mechanical drive assembly of the basic unit 2, described in more detail below, is provided for and on which an annular table 8 formed by numerous segments and extending in the shape of a polygon at the periphery is attached and which serves for positioning or fastening of the functional elements of the work stations 4. This table 8 is provided for on the lower section 7' of the machine frame 7.

On the top, the machine frame 7 has a section 7" with a reduced diameter on which the lower end of a vertical column 9 concentrically encompassing the axis V is fastened and which protrudes beyond the top of the section 7". On the column 9 there is a hollow shaft that spins on bearings, the upper end of which is attached to a rotor or rotating table element 11. At the lower end of the hollow shaft 10 and within the section 7" or within the machine casing there is a drive pulley 12 with Geneva toothing on its circumference that works together with a Geneva drive assembly 13, thus forming a Geneva drive assembly or Maltese-cross transmission of such a configuration that—with a cam 3 driven in a continuous manner on a vertical axis parallel to axis V—the drive pulley 12 and thus also the table element 11 executes a cyclic turning movement on the axis V, with turning steps and standstill periods in between these. The temporal relationship between movement time and rest time is 1/1 with a continually revolving cam. The Geneva drive assembly is furthermore constructed in such a way that during the standstill period the drive pulley 12 is blocked from turning without play by a corresponding control surface of the eccentric or Geneva drive assembly 13.

On the non-rotating column 9, an upper table element 14 is fastened above the table element 11, which, as table element 11, has a circular disk shape and the axis of which corresponds to axis V. A peripheral surface 11' of the table element 11 extends beyond the edge of the upper table element 14. Receptacles 15 are fastened to the peripheral surface 11', each of which serves to receive one sub-assembly and has a corresponding "nest" on its top, in which the sub-assemblies are arranged in an exactly specified orientation and position. The Geneva drive assembly 12, 13 is constructed in such a way that in each workpiece cycle, which has a movement step and a standstill period, the receptacles 15 are conveyed by one machine division around the axis V. The work positions 3 are arranged around the axis V according to this machine division.

A component that is available at the functional element 53 or at the supply of work station 4 is removed with a tool provided for on the support 6 of the lifting unit 5, e.g. a gripper, at the work positions 3, for example, and then, with the receptacle 15 at rest, inserted into the respective sub-assembly at the work station 4 by means of the vertical movement of the support 6 (double arrow B), so that the sub-assemblies arranged at the receptacles 15, by being conveyed from one work station to the next are increasingly put together and finally removed as a finished unit at a work station designed as a removal station by means of a tool provided for at the support 6 there for conveyance to a transporter after removal of the assembled components or units.

Above the upper table element 14, the vertical column 9 continues in several, i.e. in the depicted embodiment in four vertical rods 16, of which in FIG. 1 only one is indicated for the sake of simplicity and which are distributed in top view on the basic unit 2 around the axis V in such a way that the axes of the rods 16 form the corners of a square whose middle point corresponds to the axis V. The lower ends of the vertical support rods 16 are connected to the upper, rigid upper table element 14. A supporting plate 17 is fastened to the upper ends of the supporting rods 16.

In the column 9 or in the space between the rods 16 in the depicted embodiment two vertically adjustable lifting rods 18 and 19 are provided for, radially offset from the axis V and parallel to it. The lifting rods 18 and 19 are intended to be movable by a specified axial stroke in the upper supporting plate 17 as well as in a board 20 in the interior of the machine frame 7 or section 7', in the manner described in more detail below in synchronization with the central drive assembly of the basic unit 2, whereby the lifting rod 18 serves to produce the horizontal movement (double arrow A) of all lifting units 5 and the lifting rod 19 serves to produce the vertical movement (double arrow B) of all lifting units 5. The lifting rods 18 and 19 are provided with a wheel-like disk cam 21 and 22 that are of a pulley-like construction with a peripheral groove 21' or 22' that is open toward the circular peripheral surface. Furthermore, the disk cams 21 and 22 have several openings. For both the cam disk 21 and cam disk 22 all rods 16 and the lifting rods 18 and 19 are led through these openings. The upper disk cam 21 in FIG. 1 glides on the rods 16 as well as the lifting rod 19 and is firmly connected to the lifting rod 18. The lower disk cam 22 in the figures glides on the rods 16 and the lifting rod 18 and is firmly connected to the lifting rod 19, so that the disk cam 21 is moved up and down only with the lifting rod 18 and the disk cam 22 is moved up and down only with the lifting rod 19.

In the following the central drive assembly of the basic unit, the lifting units and the functional elements 4 are described in more detail.

Drive Assembly of the Basic Unit 2

The drive assembly of the basic unit 2 includes an electric motor not depicted in the figures that is housed in the machine frame 7 and serves to drive all elements of the basic unit. The output shaft of the electric motor is connected to an angular gear whose output shaft 24 leads out of both ends of the casing of this angular gear. By means of a gear array 25 at one end of the shaft 24 a shaft 26 is driven, the axis of which spins on bearings parallel to the axis V in the interior of the machine frame 7 and, by means of a pinion 27 on this shaft, drives a crown gear that spins on bearings around the axis V in the machine frame 7. The crown gear 28 serves to drive special functional elements of the work stations 4 in the manner described in more detail below.

The other end of the shaft 24 is provided with a support 29 for two cam plates 30 and 31. This end of the shaft 24 also drives a transmission 32 designed as an angular gear, whose vertical output shaft 33 drives the eccentric 13 or Geneva drive assembly 12/13. In the drive train between the support 29 and the input of the transmission 32 there is a safety clutch 34 that mechanically disengages when a specified torque is exceeded and disconnects the transmission 32 from the drive assembly. The safety clutch 34 has an axially movable element 34' for this purpose that assumes an axially displaced position from the normal position when the safety clutch is disengaged. The position of the element 34' is continuously polled or monitored by means of an electric sensor 35. This sensor 35 controls an electromagnetic brake 36 provided for on the transmission 32 that, due to the signal of the sensor 35, immediately blocks the transmission 32 when the safety clutch 34 is engaged and maintains this blockage until the safety clutch 34 is again engaged or the drive is restored by means of the safety clutch. Engaging of the safety clutch 34 takes place by slow turning of the shaft 24 in a direction of rotation opposite of the normal direction of rotation during operation of the basic unit 2.

Furthermore, the safety clutch 34 is designed in such a way that re-engaging the safety clutch 34, i.e. restoring the drive connection by means of this clutch is only possible in a single relative position of the input and output of this clutch, so that after each re-engagement of the safety clutch 34, especially by blocking of the transmission 32, a specified phase position between the rotating position of the cam plates 30 and 31 and the rotating position of the drive assembly 12 is restored. Blocking of the transmission 32 when the safety clutch 34 is actuated or disengaged ensures that the table element 11 is stopped immediately when actuating the safety clutch 34 and no relative movement is possible that could alter the phase position between the cam plates 30 and 31 and the position of the table element 11.

The drive of the lifting rods 18 and 19 takes place by means of an oscillating crank 37 or 38 that pivots on bearings in the machine frame 7 on an axis parallel to the axis of the shaft 24. The oscillating crank 37 for the lifting rod 18 is designed as a one-armed lever that pivots on bearings on one end and on the other end bears with a cam roller 39 on the upper part of the cam plate 30. The free end of the oscillating crank 37 is connected to the lower end of the lifting rod 18 by means of a double-jointed intermediate lever 40, so that the lifting rod 18 is moved up and down following the form of the peripheral surface of the cam plate 30. The oscillating crank 38 for the lifting rod 19 is designed as a double-armed offset lever that pivots on bearings in the middle and supports a cam roller 41 on one end that is pressed against the peripheral surface of the cam plate 32 by means of springs 42. The other end of the oscillating crank 38 is connected by means of a double-jointed intermediate lever 43 to the lower end of the lifting rod 19.

By connecting the cam plates 30 and 31 to the support 29, an adjustment of the cam plates by moving these plates on the axis of the shaft 24 is possible. The cam plates can be affixed to the support 29 by connecting elements not depicted.

The transmission assembly 32 with the brake 36 and the sensor 35 forms an interchangeable unit. For one basic unit 2 there are preferably several, for example four different interchangeable transmissions 32 of such a construction that with a first type of transmission 32 a continuous drive of the shaft 33 is achieved when the input shaft is driven in a continuous manner, resulting in a ratio of movement time/standstill time of 1/1 by means of the Geneva drive assembly 12, 30 as described above.

Other types of the transmission 32 are designed in such a way that when the input shaft of this transmission is rotating in a continuous manner the shaft 33 has a periodically changing rotating speed through the use of corresponding elliptical gearwheel in the transmission 32 in such a manner that, e.g. for a second type of the transmission the ratio of movement time/standstill time is 1.8/1, for a third type of the transmission 32 the ration of movement time/standstill time is 1/4.3 and for a fourth type the ration of movement time/standstill time is 1/1.8.

The cam plates 30 and 32 are designed in such a way that each lifting rod 18 and 19 executes one complete stroke from an initial position into a work position and back to the initial position in each workpiece cycle.

For the above-mentioned third and fourth types of transmission 32, cam plates 30 and/or 31 can be used of such a type that at least one of the lifting rods 18 and 19 executes two stroke movements during a workpiece cycle, e.g. the lifting rod 19 for installing a functional element and for subsequent turning or inspecting of the unit in the receptacle 15 or the nest there.

Work Station 4

All work stations 4 are standardized as far as possible, in the depicted embodiment essentially in two parts. Each work station includes a platform 50 that comprises a clamping or fixing plate 51 and a support 52, and that can be fastened to the table 8 with the help of screws or other suitable fastening elements. The elements for fastening the clamping plate 51 to the table 8 are likewise standardized in such a way that fastening of the platform 50 to the table 8 in the required orientation and position is possible without further adjustments to the table 8. Especially an adjustment of the platform 50 in relation to the radial distance from the axis V as well as in relation to the orientation of a horizontal axis C of the platform 50 is possible.

The support 52 is adjustable especially for this orientation of the axis C (e.g. rotatable) and can be fixed to the clamping plate 51 in the respective adjustment. On the top of the support 52 the element 53 typical for the respective work station 4 is provided for, e.g. a supply for a certain element. This element of the work station 4 that is more adapted to the respective element can also consist of partially standardized components. A special feature is the fact that the platform 50 has a shaft 54 that spins on bearings in the support 52 on the same axis as axis C and that is connected to at least one control unit for driving active elements of the functional element 53 housed in the housing of the support 52. For example, at least one cam plate is provided for on the shaft 54 for controlling rockers, slides etc. that are part of the functional element 53. A mechanical control of such functional elements of the work station 4 is possible by means of the shaft 54 and the control or gear array, and takes place at high speed, without delay and exactly in synchronization with the drive assembly of the basic unit 2.

The shaft 54 is connected by means of a universal-joint shaft to an angular gear 56 that is fastened to the horizontal section 7''' of the machine frame 7 at an opening 57 provided for there. The angular gear 56 is flange-mounted to the section 7''' in the area of this opening and is in mesh with a gearwheel 58, with the toothing of a crown gear 28, provided for at the input shaft of the angular gear 56. Where a platform 50 with the control drive assembly formed by the shaft 54 is not necessary at a work position 3, the opening 57 is closed by a cover not depicted.

The depicted embodiment of the work station 4 has considerable advantages. For one thing, the same platform 50 can always be used for various functions of this work station; the functional element 53 that is more adapted to the work station is then mounted to this platform 50. Each work station 4 is interchangeable and can be tested, adjusted and/or repaired outside of the automatic production machine 1 especially with regard to the control drive assembly (shaft 54). With the mechanical drive via the angular gear 56, the universal-joint shaft 55 and the shaft 54, instantaneous control of the functional elements of the functional element 53 is possible in synchronization with the operation of the automatic production machine 1, so as to enable high performance.

Flange-mounting of the angular gear to the horizontal section 7''' ensures simple mounting of the respective angular gear. Furthermore, it is possible to turn the respective angular gear 56 on the axis of the horizontal input shaft on which the gearwheel 58 is provided for, so that the position or orientation of the shaft 54 in the horizontal plane can be changed, e.g. for a slanted or non-radial array of this shaft and thus of the work station 4 in relation to the axis V, as far as this is necessary in special cases. The universal-joint shaft 55 compensates for tolerances in the orientation between the output shaft of the angular gear 56 and the shaft 54. Flange-mounting of the angular gear 56 to the horizontal section 7''' ensures that the height of the output shaft of the angular gear is exactly defined and thus adapted to the height of the shaft 54. With the platform 50, the work station 4 or its functional element 53 can be adjusted in all three spatial axes. The universal-joint shaft 55 is preferable designed as a telescoping universal-joint or cardan shaft with universal joints at both ends, so that after flange-mounting of the respective angular gear 56, the work station 4 can be adjusted in all three spatial axes.

Lifting Unit 5

The lifting unit 5 includes a base plate 60 that is fastened to the top of the table element 14 and on which two vertical guide rods 61 and 62 are held by its lower end. These guide rods have their axes in a plane that also encompasses the axis V, i.e. the guide rod 61 is radially further out than the guide rod 62 in relation to the axis V. On the two guide rods 61 and 62 there is a vertically guidable block or slide block 63. On the slide 63 there is a slide 64 that can be guided horizontally and radially to the axis V. The latter has a support 6 on its radially outer end.

The upper ends of the guide rods 61 and 62 are fastened to a supporting plate 65 that is screwed to the supporting plate 17 by means of a retaining arm 66. An offset control lever 67 is fastened to the supporting plate 65, one end of which bears against the bottom of the edge of the upper disk cam 21 and the other end of which meshes with a vertical guide of the slide 64 in such a way that a vertical movement of the slide array 63/64 effects no horizontal movement of the slide 64 without pivoting of the control lever 67. The number 68 refers to a spring that operates between one end of the control lever 67 and the disk cam 21 and presses this end or a cam roller provided for on this end against the bottom of the cam disk 21. By raising and lowering of the cam disk 21 the lever 67 is pivoted so that the slide 64 executes the horizontal lifting movement (double arrow A).

A second pivotable control lever 69 is provided for on the middle of the platform 60, one end of which meshes with the peripheral groove 22' of the disk cam 22 and the other end of which bears against the bottom of the slide 63. Lowering the disk cam 22 causes the slide 63 and thus also the slide 64 to be raised vertically. Conversely, raising of the disk cam 22 causes the slide 63 to be lowered.

The control lever 69 has several bore holes offset against each other in the longitudinal direction of this lever. Furthermore, several bore holes are provided for in a bearing element 70 which is provided for on the control lever 69 on the platform 60, so that the position of the hinge point 71 of the control lever 69 can be set for a different transfer of the control lever 69 and thus for a different lift of the slide 63 for the same stroke of the disk cam 22 for all work positions 3.

Just as the transfer rate of the control lever 69, the transfer rate of the control lever is also adjustable, e.g. by using different control levers 67 to adapt the horizontal stroke of the slide 64 to the requirements of the respective work position 3 or work station 4.

As indicated in the FIGS. 1–4, there can also be more than two disk cams, e.g. three disk cams 21, 22 and 21*a* stacked vertically, in which case a separate lifting rod is provided for each disk cam.

Figure 5:
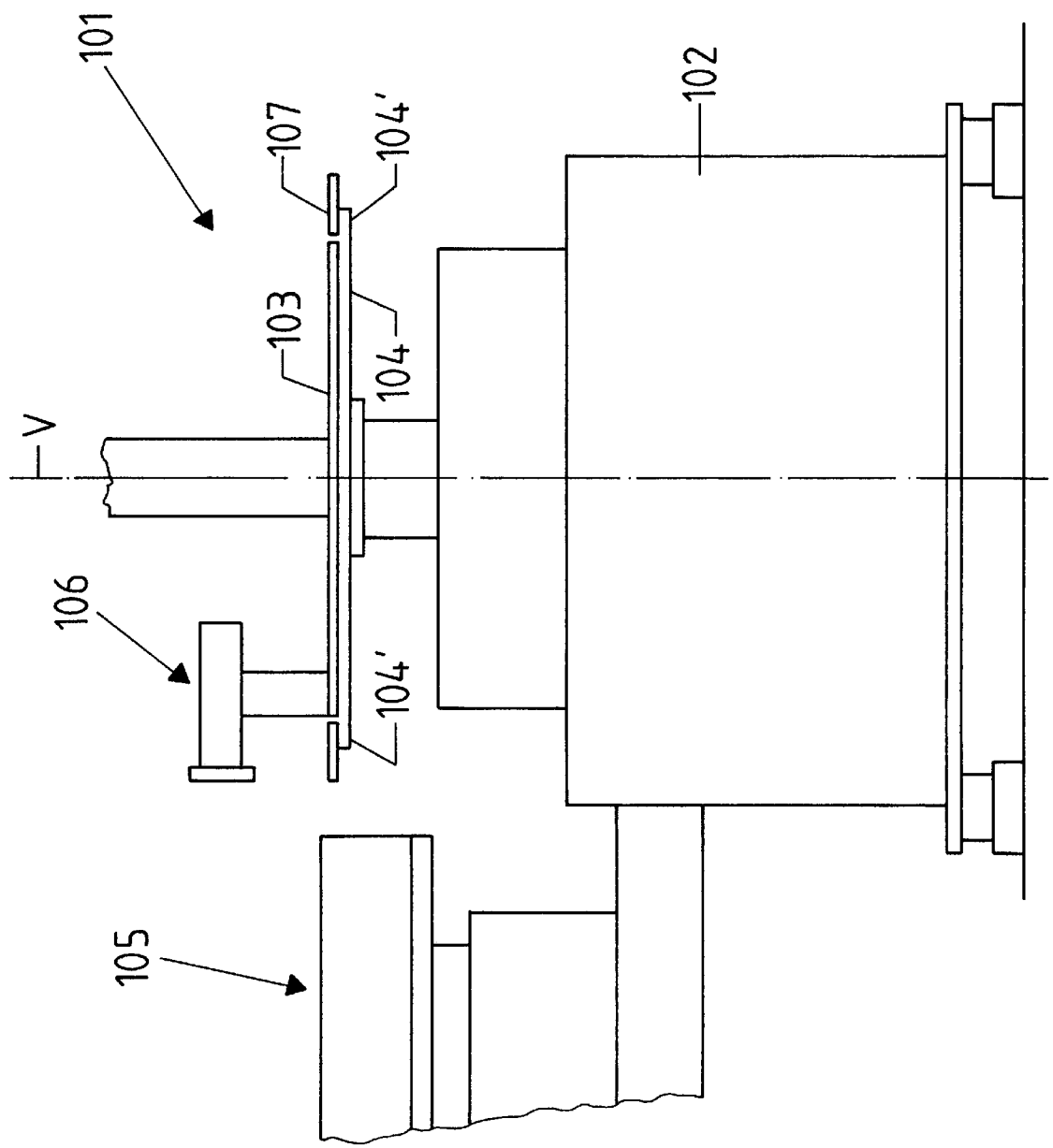
FIG. 5 shows a simplified depiction in side view of the basic unit of an automatic production machine.

The basic unit depicted in FIG. 5 is part of an automatic production machine 101 that is otherwise not further depicted and consists essentially of a jig stand 102, on the top side of which there is a horizontal, circular disk shaped, non-rotating table element 103 on a column that is axially equivalent to a vertical machine axis V. Under this table element 103 a likewise circular disk shaped table element 104 is situated which is rotatable on the horizontal axis V and of which a peripheral surface 104' extends beyond the periphery of the table element 103. The table element 104 is driven in cyclic movement around the axis V by a non-depicted drive assembly.

On the outside of the jig stand there are feeding devices and other work stations 105 distributed around the axis V. On the table element 103 further functional elements 106, e.g. grippers etc. are attached. Each functional element 106 is then allocated to a station 105, for example.

Receptacles 107 are connected to the peripheral surface 104' of the table element 104 at regular angle intervals around the axis V and extending from this peripheral surface 104 and which in the depicted embodiment include a rectangular plate 108 the surfaces of which are on a horizontal plane, i.e. on a plane perpendicular to axis V and the longer middle axis of which is positioned radially to the axis V. The top of each plate 108 is on a plane with the top of the table element 103. The part of the plates 108 extending beyond the peripheral surface 104' form "nests" 109 on the top that serve to hold a part or sub-assembly to be assembled into a finished product in the automatic production machine in that the nests 109 are conveyed past the stations 105 in a cyclic movement, whereby a further assembly or inspection step for the element located in a nest 109 takes place at each station, so that with the cyclic conveyance of each receptacle 107 the unit located there is gradually assembled into a completed product.

The special feature of the depicted basic unit 101 resides in the fact that the receptacles 107 are plugged into sockets on the rotating table element 104 and thus are interchangeable. For this purpose there are retainers 110 distributed around the axis V on the upper peripheral surface 104' at regular angle intervals forming holders 110' that essentially have the form of rectangular plates in the depicted embodiment. The long side of these are positioned at a tangent to an imaginary circle around the axis V. Each retainer 110 has a recess or countersinking 111 or 112 in the area of its shorter side such that the retainers 110 that are essentially rectangular on the top have a trapezoidal bottom with two essentially parallel trapezoid sides 113 and 114 and two angled trapezoid sides 115 and 116. From these the trapezoid side 113 for a retainer 110 fastened to the table element 104, in relation to the axis V, is located radially inward and the trapezoid side 114 is located radially outward, both at a tangent to an imaginary circle encompassing the axis V. The two angled trapezoid sides 115 and 116, both of which are formed by a recess 111 or 112, both form smooth surfaces perpendicular to the top and bottom of the plate-shaped retainer 111 and, with a retainer 110 mounted on the table element 104, both are perpendicular to the plane of this table element. The planes of the trapezoid sides 115 and 116 both form an acute angle a with the adjacent short side of the plate-shaped retainer 110 that opens toward the axis V of the basic unit 101 at an angle of e.g. 6°–10°.

Furthermore, the recesses 111 and 112 are formed in such a way that the top of the retainer 110 forms a plate section 117 or 118 extending beyond the trapezoid side 115 or 116, respectively. In each retainer 110 there is a bolt-like catch element 119 that can be moved longitudinally against the effect of a compression spring 120, in a recess 121 and in an axial direction L, parallel to the planes of the tops of the retainers 110 and forming an acute angle b, i.e. an angle considerably smaller than 45°, with the radially inner longitudinal or trapezoid side 113 or its imaginary extension opening toward the trapezoid side 115. On the trapezoid side 116 the recess 121 is open. Furthermore, the design is such that the catch element 119, with a tapered end 119', extends beyond the surface formed by the trapezoid side 116'.

In assembled condition, each receptacle 107 or its plate 108 is located in the retainer 110' between two adjacent retainers 110 at the peripheral surface 104', that are at a distance from each other such that the evenly formed longitudinal side 108' of the respective plate 108 bears against the even surface or trapezoid side 115 of a retainer 110. The other longitudinal side 108" of the plate 108 is adjacent to the trapezoid side 116 of an adjacent retainer 110. The catch element provided for on this adjacent retainer 110 meshes with its end 119' in a catch groove 122 on the long side 108". Furthermore, the spring 120 presses the longitudinal side 108' of the respective receptacle or plate 108 tightly against the trapezoid side 115.

By means of the extending sections 117 and 118 that extend beyond the top of the respective plate 108, this plate fits positively on both longitudinal sides 108' and 108" in the pocket-like recesses 111 and 112.

Figure 6:
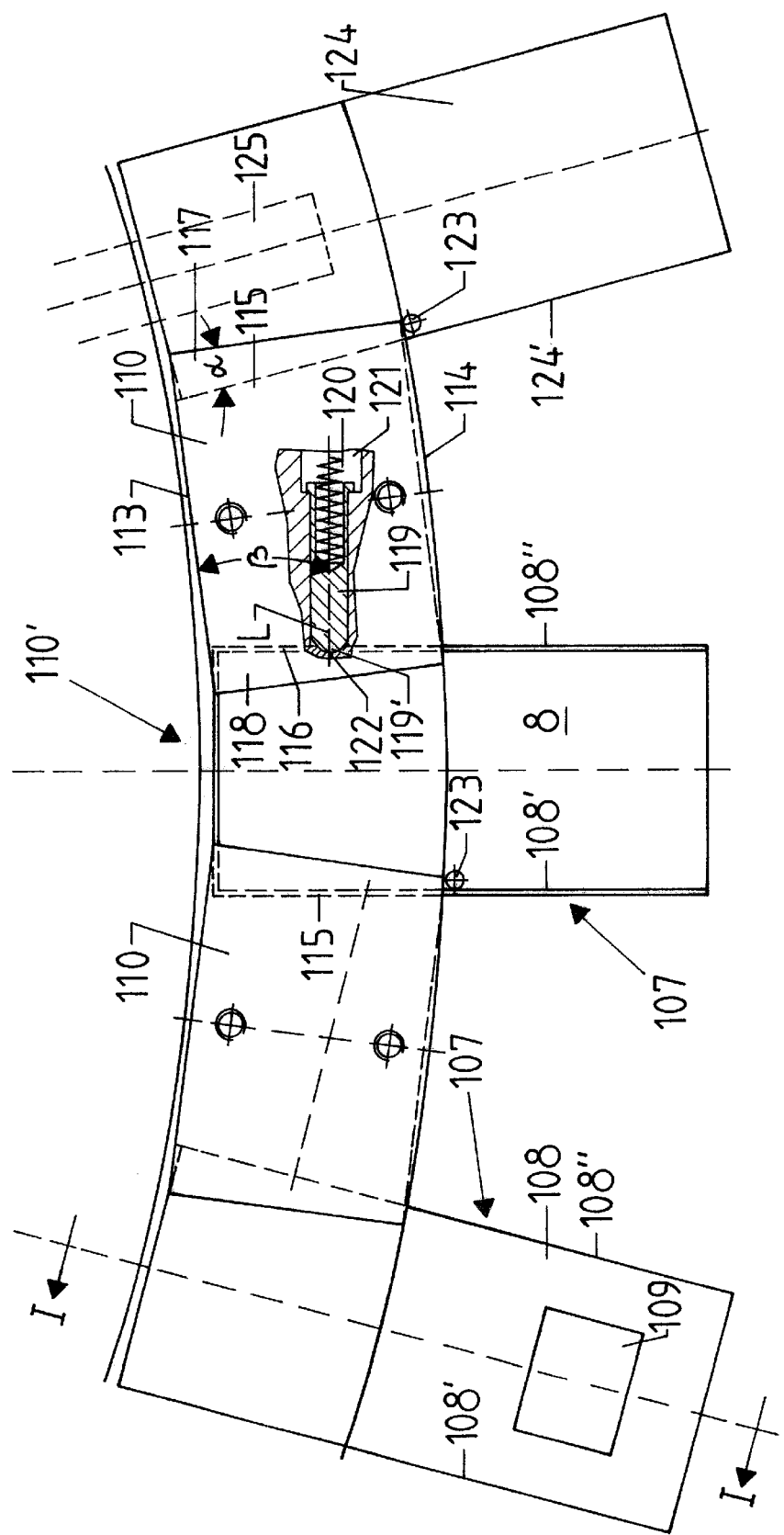
FIG. 6 a partial depiction in top view of the pulse-driven rotary table in FIG. 5.
Figure 7:
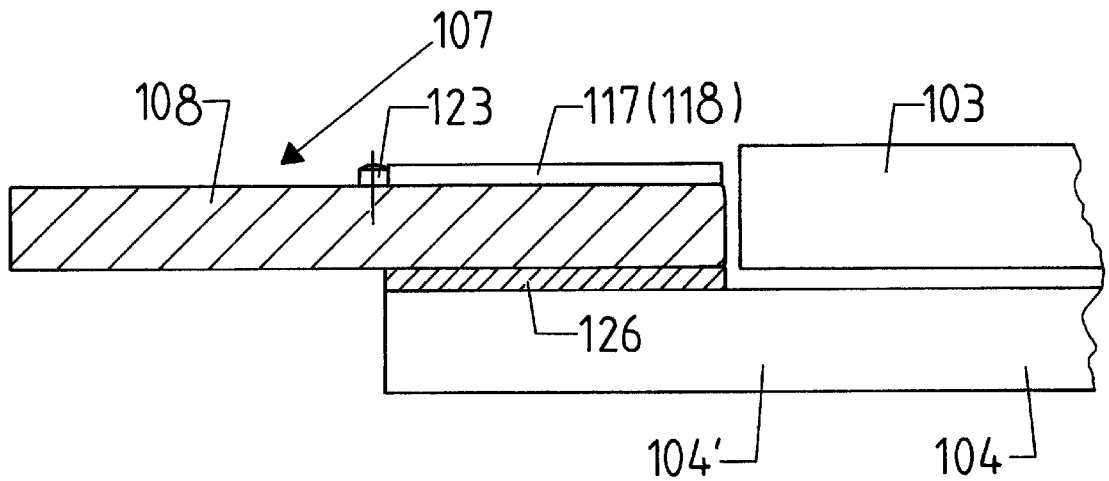
FIG. 7 a view corresponding to the line 1—1 in FIG.
Figure 8:
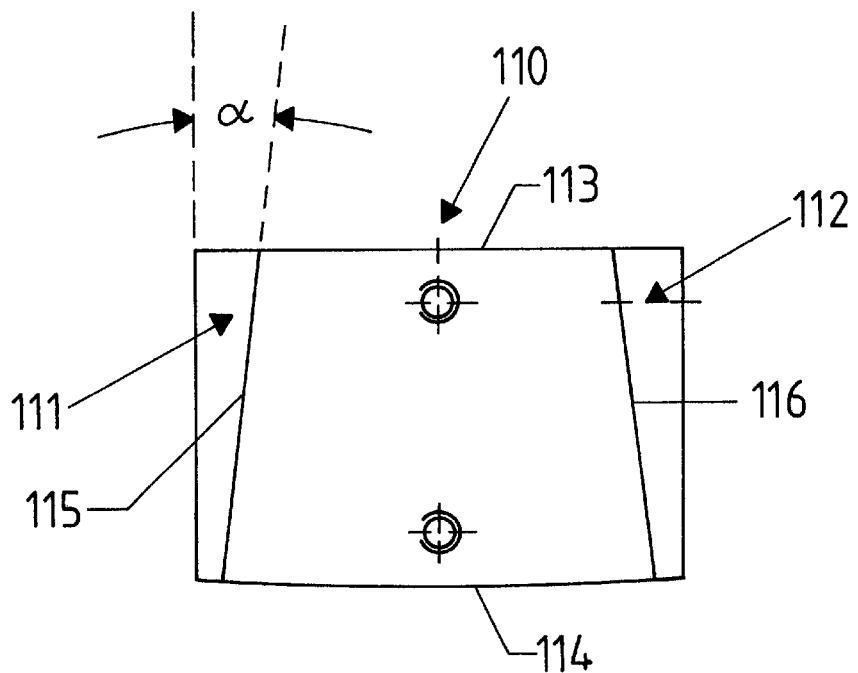
FIG. 8 a bottom view of one of the retainers for the receptacles of the basic unit in FIG. 5.

Furthermore, each plate 108 has a pin 123 on the long side 108' that bears against the outer long side of a retainer 110 for each plate 108 that is completely inserted into the holder 110'. With the respective pin 123 and with the long side 108' bearing against the trapezoid side 115 of the same retainer 110, each receptacle 107 is precisely oriented or adjusted in relation to the retainer 110 provided for to the left of each receptacle 107 in FIG. 6, so that upon precise mounting of the retainer 110 at the peripheral surface 104' the receptacles 104 are also exactly positioned after insertion into the pocket-like holders 110'.

For fastening or fixing of the retainer 110 at the peripheral surface 104' a tool is used that corresponds in shape to a plate 108, but is fastened or fixed to the rigid table element 103 with the help of a fixing element 125 in such a way that one of the long sides 124' of the tool 124 corresponding to the long side 108' has the exact position that this long side 108' or the trapezoid side 115 of the retainer 110 to be fastened should have.

In order to fasten a retainer 110, its trapezoid side 115 is placed on the long side 124' of the tool 124 lying on the peripheral surface 104' in such a way that the outer long side or trapezoid side 114 of the retainer 110 likewise bears against the pin 123 provided for on the tool 124. Afterwards the plate-shaped retainer is connected with screws to the peripheral surface 104' and then fastened with pins in the exact position.

The table element 104 is then turned one division further in such a way that the previously fastened retainer 110 moves away from the bearing surface 124', allowing the tool 124 to remain on the table element 103. By attaching an additional retainer 110 with its trapezoid side 115 against the bearing surface 124', this retainer can also be exactly positioned in the manner described above. The space between the two retainers 110 is set by using a receptacle 107, for example. The retainers 110 are also made with slight tolerances on the bottom of the extending sections 117 and 118, so that exact positioning of the height is possible by means of the bottom of the extending sections 117 and 118, against which the top of the respective receptacle 107 bears. In order to compensate for tolerances in the thickness of the plates 108, equalizing plates 126 are provided for between the top of the peripheral surface 104' and the bottom of the respective plate 108.

Figure 9:
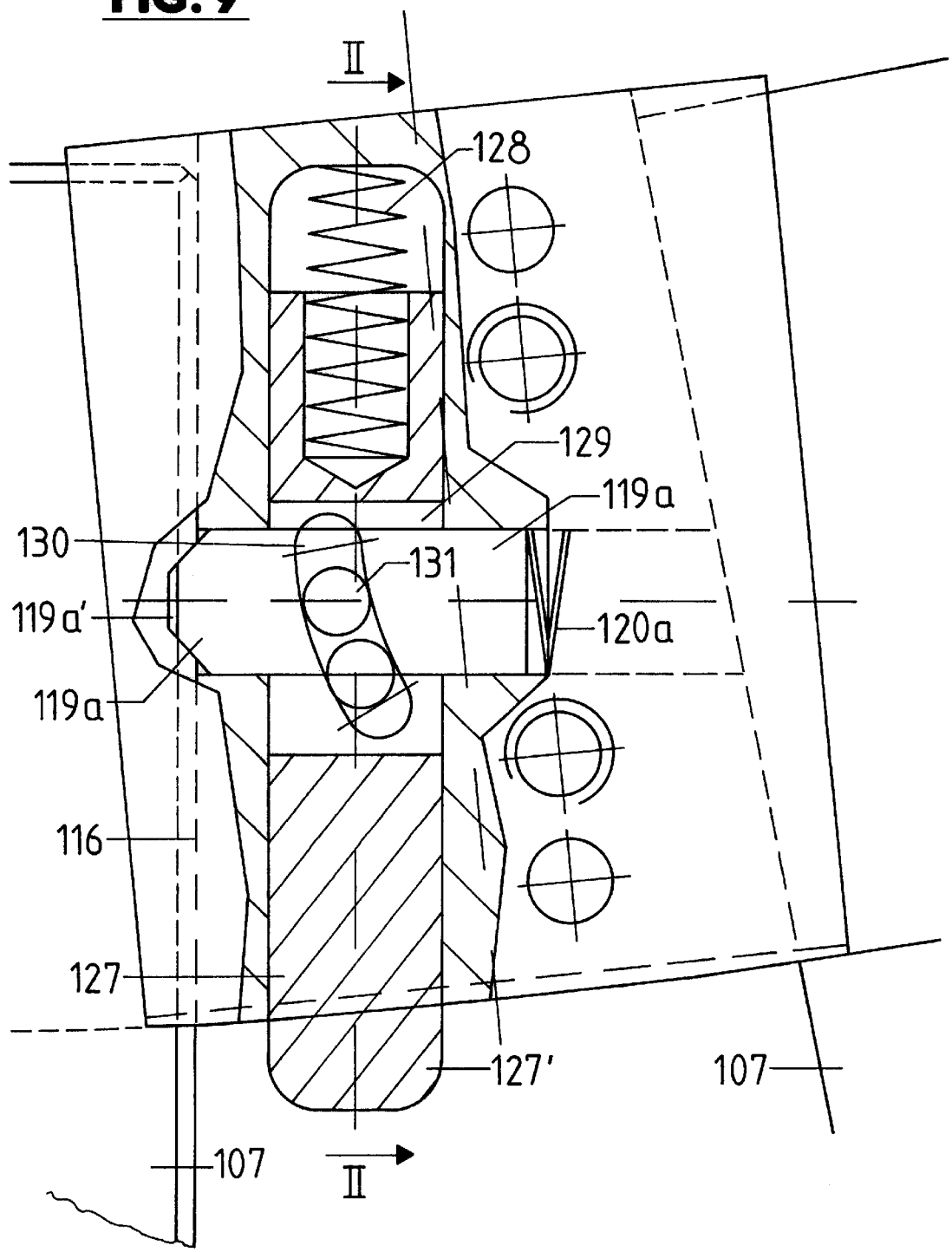
FIG. 9 a simplified depiction in top view of a modified embodiment of a retainer for use in the automatic production machine in FIG. 5.
Figure 10:
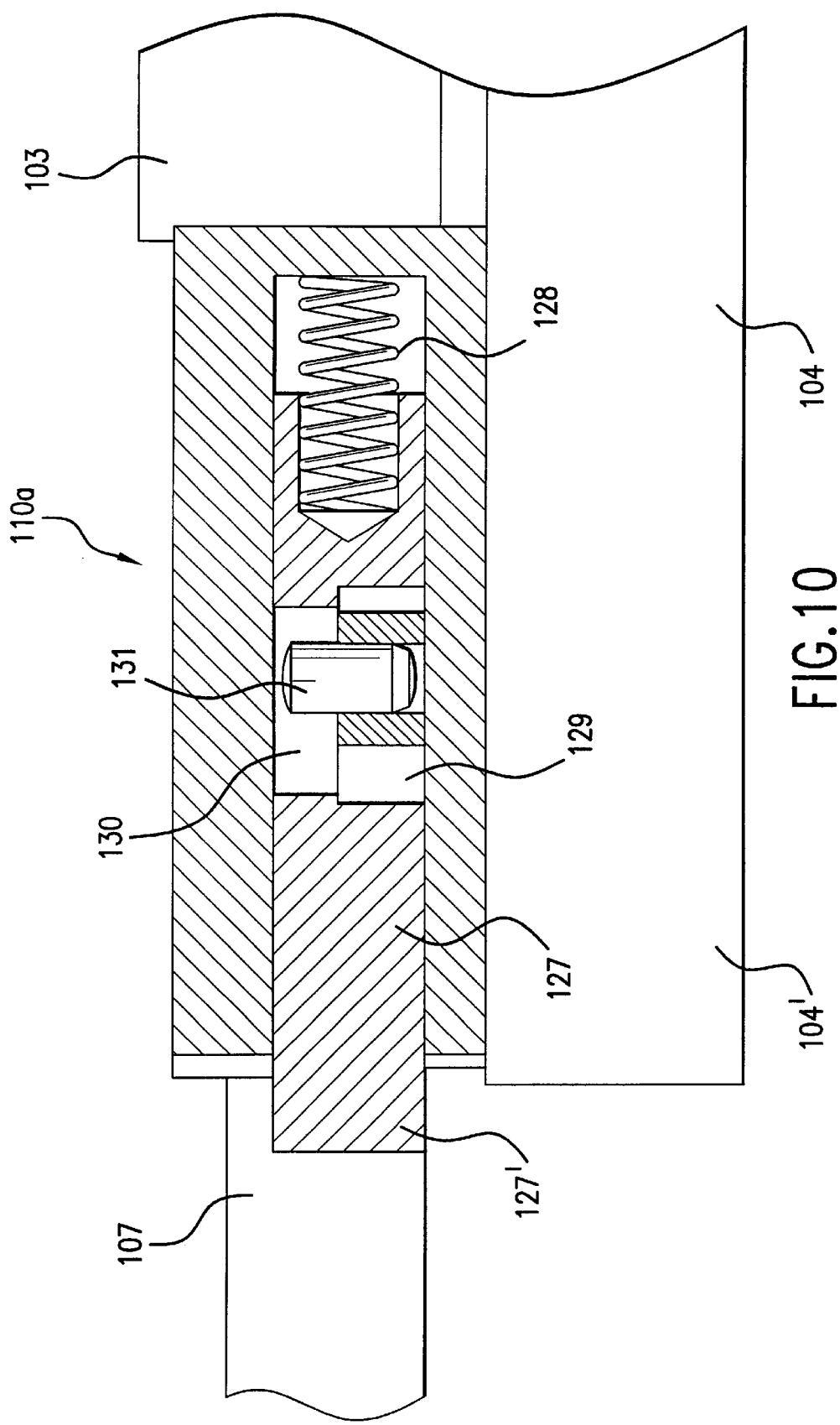
FIG. 10 a view corresponding to line 11—11 of FIG. 9.

FIGS. 9 and 10 show a retainer 110a that corresponds to the retainer 110 in its basic form and function and likewise possesses a catch element 119a that is under the force of the compression spring 120a and that serves to lock the respective receptacle 107 in place as described above for the catch element 119 of the retainer 110.

The special feature of the retainer 110a is that it provides for a moveable actuating and control slide 127 in an axial direction perpendicular to the movement direction of the catch element 119a, against the effect of the compression spring 128 from a non-actuated position, in which the catch element 119a is in the position holding the receptacle 107, and an actuated position, in which the catch element 119a is moved back by the control slide 127 from the holding position (e.g. for releasing the receptacle 107). The end 127' of the control slide 127 extends beyond the front side of the retainer 110a and thus, for a retainer mounted on a table element 104, also beyond the outer periphery of this table element, so that it can be pressed essentially radially inward against the force of the compression spring 128 in relation to the axis of the table element 104.

The control slide 127 has a recess 129 on its side that is penetrated by a catch element 119a. The size of the recess 129a in the axial direction of the control slide 127 determines the maximum stroke for this control slide.

In the area of the recess 129 the control slide 127 also has a radial cam 130 that is formed by a corresponding opening in the bottom of the recess 129. A guide pin provided for on the catch element 119a fits into the radial cam 130. The shape of the radial cam 130 for the guide pin 131 fitting into it is such that when the control slide 127 is in its non-actuated position, the catch element 119a is in its locked or fixing position and is also locked in this position in such a way that unwanted release of the receptacle 107 by the respective catch element 119a is not possible. By pressing the control slide 127, i.e. by moving this control slide against the compression spring 128 radially or somewhat radially inward toward the axis of the table element 104, the catch connection between the catch element 119a and the receptacle 107 held by it is released.

For the functions mentioned above the shape of the radial cam 130 is generally such that it forms an angle considerably smaller than 45° with the longitudinal axis of the control slide 127 opening toward the side opposite of the axis of the table element 104. Furthermore, the inner end, i.e. the end of the radial cam 130 adjacent to the spring 128, is closer to the side 116a of the retainer 110a extending beyond the side of the catch element 119a than the other end of the radial cam 130. The angle formed by the radial cam 130 with the axis of the control slide 127 is considerably smaller than 45°, so that pressure on the end 119a' cannot cause movement of the control slide 127 across the guide pin 131 and the radial cam 130. The retainers 110, 110a and receptacles 107, as well as the table elements 103 and 104, are preferably made of metal.

List of reference symbols automatic production machine
basic unit
work position
work station
lifting unit
support
machine frame
7', 7" section
7'" shoulder
8 table
9 column
10 hollow shaft
11 table element
11' peripheral surface
12 drive assembly
13 eccentric or geneva drive assembly
14 table element
15 receptacle
16 rod
17 supporting plate
18, 19 lifting rod
20 board
21, 21a, 22 disk cam
21', 22' peripheral groove
23 angular gear
24 shaft
25 gear array
26 shaft
27 pinion 28 crown gear
29 support
30, 31 cam plate
32 transmission
33 shaft
34 safety clutch
34' clutch element
35 sensor
36 magnetic brake
37, 38 oscillating crank
39 cam roller
40 intermediate lever
41 cam roller
42 spring
43 intermediate lever
50 platform or block
51 clamping plate
52 support
53 functional element
54 shaft
55 universal-joint shaft
56 angular gear
57 aperture
58 gearwheel
60 base platform
61, 62 guide rods
63 slide block
64 slide
65 supporting plate
66 retaining arm
67 control lever
68 spring
69 control lever
70 bearing element
71 hinge point
101 basic unit
102 jig stand
103 table element
104 table element
104' peripheral surface
105 work station
106 functional element
107 receptacle
108 plate
108', 108" longitudinal side
109 nest
110,110a retainer
110' holder/mounting area
111, 112 recess
113–116, 116a trapezoidal side
117, 118 section
119, 119a catch element
120 compression spring
121 recess
122 catch groove
123 pin
124 adjusting tools
124' bearing surface
125 fixing element
126 equalizing plate
127 control slide
127' end
128 compression spring
129 recess
130 radial cam
131 guide pin

What is claimed is:

1. An automatic production machine comprising:
   a rotor that is rotatable around a vertical axis of the machine,
   several receptacles on a periphery of the rotor for workpieces to be assembled or for sub-assemblies,
   a central drive means for the rotor for moving the rotor and the receptacles on it in a stepwise movement from a work position to a next work, position,
   a plurality of working stations around the rotor, each working station on a working position,
   a first functional or tool elements at each work position or station,
   a control unit being common for the first tool elements and driven by a central drive assembly for producing a first and a second type of controlled movement of the first tool elements in synchronization with the stepwise movement of the rotor,
   wherein the common control unit has at least two lifting or tie rods which are guided in a central part of a machine frame with their axis parallel to the machine axis, but radially offset from it and offset from another and which are axially moved up and down by the central drive assembly,
   at least two disk cams in the direction of the machine axis one above the other,
   the disk cams being attached each on an axially movable lifting or tie rod of the at least two lifting and tie rods,
   each disk cam having its own lifting rod and forming a cam surface for control elements of the first tool element such, that upon up and down movement of the lifting or tie rods and their disk cams,
   the first tool elements are driven for the first type of movement by the axial movement of a first lifting or tie rod of the at least two lifting and tie rods with the first type of movement being a movement in axial direction in respect to the vertical machine axis, and
   the first tool element being driven for the second type of movement by the axial movement of a second lifting or tie rod of the at least two lifting and tie rods.

2. The automatic production machine in accordance with claim 1, further comprising a safety clutch is provided for in a drive train between a motor driving the rotor and the rotor in order to disengage the drive train upon exceeding a specified torque and that a brake is provided for in the drive train after the safety clutch, blocking the rotor when the safety clutch is disengaged.

3. The automatic production machine in accordance with claim 1, wherein guide rods are distributed on the machine axis with their axes parallel to the machine axis and radially offset in relation thereto, and that the disk cams on these guide rods are movably guided.

4. The automatic production machine in accordance with claim 1, wherein the a primary functional element has a support on which a tool can be attached, that the support is on a slide that is movable in a first axial direction, that the slide is located on an auxiliary slide that is movable in a second axial direction, and that the primary functional element has a first control unit for moving the slide in the first axial direction and a second control element for moving the slide in the second axial direction.

5. The automatic production machine in accordance with claim 1, wherein the control elements are control levers.

6. The automatic production machine in accordance with claim 1, wherein a transfer rate of the control elements can be adjusted.

7. The automatic production machine in accordance with claim 1, wherein more than two lifting rods are provided for and that the disk cam is attached to each lifting rod.

8. The automatic production machine in accordance with claim 1, wherein the lifting rod is guided through the disk cams.

9. The automatic production machine in accordance with claim 1, wherein a primary functional elements are lifting units.

10. The automatic production machine in accordance with claim 1, further comprising work stations on the machine frame of the automatic production machine that have secondary functional elements on a common platform for work stations that is adapted to a respective work station.

11. The automatic production machine in accordance with claim 10, wherein the secondary functional units are feeders.

12. The automatic production machine in accordance with claim 1, wherein an auxiliary drive assembly is formed by a gearwheel or crown gear driven in a continuous manner on the machine axis and that control drives consist of an angular gear with a gearwheel that can mesh with the gearwheel or crown gear at an input and with at least one shaft at an output.

13. The automatic production machine in accordance with claim 12, wherein the angular gear can be flange-mounted to an opening on a case-like machine frame.

14. The automatic production machine in accordance with claim 12, wherein the angular gear can be flange-mounted to a horizontal surface of the machine frame.

15. The automatic production machine in accordance with claim 1, further comprising a Geneva drive assembly provided for in a drive train between a motor driving the rotor and the rotor.

16. The automatic production machine in accordance with claim 1, wherein an interchangeable transmission for realization of different movement and standstill times is provided in a drive train between a motor driving the rotor and the rotor.

17. The automatic production machine in accordance with claim 1, wherein a primary functional elements consist of a standardized platform and a functional unit mounted on the platform.

18. The automatic production machine in accordance with claim 1, wherein a drive shaft for a control drive assembly of a work station is provided for on the platform.

19. The automatic production machine in accordance with claim 1, further comprising a work station comprising a standardized platform and a functional unit mounted on the platform and adapted to a function of the work station, and that at least one drive assembly for a mechanical control drive assembly of the work station is provided for in the platform shaft coupled to an auxiliary drive assembly of the automatic production machine.

20. The automatic production machine in accordance with claim 1, further comprising a jig stand and with at least one rotatable table element located on the jig stand with several receptacles provided for on a periphery of the table element for components or workpieces to be assembled or for sub-assemblies, whereby the receptacles are attached to the table element by means of holders, the receptacles are connected by sockets radially to the axis of the table element.

21. The automatic production machine according to claim 20, wherein the holders or retainers forming these have pocket-like recesses that fit positively with an opposite side of the receptacles supported by the table element or the holders on one side and that form at least one first arrangement for an exact orientation and/or positioning of the receptacles on a periphery.

22. The automatic production machine according to claim 21, wherein the holders or retainers each form at least one second arrangement for setting a radial distance of the receptacles from an axis of the table element.

23. The automatic production machine according to claim 20, wherein the receptacles form opposite surfaces for arrangements.

24. The automatic production machine according to claim 20, wherein the arrangements for each receptacle have a common retainer.

25. The automatic production machine according to claim 20, further comprising at least one catch element for locking of the receptacle in a holder formed by at least one retainer.

26. The automatic production machine according to claim 25, further comprising a control slide for actuating and locking the catch element in a position fixing the receptacle.

27. An automatic production machine according to claim 1, wherein each disk cam is additionally guided on rods arranged parallel to the lifting rod of the respective disk cam.

28. An automatic production machine according to claim 1, wherein each disk cam on one lifting or tie rods is additionally guided on the lifting or tie rods of an other disk cam.

* * * * *